United States Patent [19]

Heidenreich et al.

[11] 4,325,024
[45] Apr. 13, 1982

[54] SYSTEM FOR MEASURING SIGNAL LEVELS

[75] Inventors: Karl-Heinz Heidenreich, Riederich, Fed. Rep. of Germany; Helmut Wachtelborn, Parsippany, N.J.

[73] Assignee: Wandel & Goltermann GmbH & Co., Eningen, Fed. Rep. of Germany

[21] Appl. No.: 168,751

[22] Filed: Jul. 11, 1980

[30] Foreign Application Priority Data

Jul. 14, 1979 [DE] Fed. Rep. of Germany ....... 2928517

[51] Int. Cl.³ ...................... G01R 17/06; G01R 15/10
[52] U.S. Cl. ................................ 324/99 D; 324/111; 324/132
[58] Field of Search .................... 324/98, 99 R, 99 D, 324/111, 120, 132

[56] References Cited

U.S. PATENT DOCUMENTS 3,159,787 12/1964 Sexton et al. ...................... 324/99 R
3,584,295 6/1971 Bayer et al. ....................... 324/57 R

FOREIGN PATENT DOCUMENTS 1616101 4/1977 Fed. Rep. of Germany .

Primary Examiner—Ernest F. Karlsen
Attorney, Agent, or Firm—Karl F. Ross

[57] ABSTRACT

An incoming a-c signal, whose amplitude is to be measured, successively passes through several decadic attenuator stages settable by respective cascaded decadic stages of a reversible counter. The attenuated signal is rectified and its voltage, or the RMS value thereof obtained from a squarer, gives rise to a calibration current, opposed by a constant reference current, for charging a capacitor of a current/frequency converter with a resulting current corresponding to their difference. Two threshold detectors in that converter, responding to a capacitor charge of either polarity beyond a predetermined limit, trigger a monoflop which fully or partly discharges the capacitor and steps the counter forward or backward as determined by a polarity sensor connected across the capacitor. A retriggerable second monoflop, responsive to the trailing edge of each stepping pulse, enables the second-lowest counter stage to be stepped out of turn when these pulses follow one another at high rate. The readings of the counter stages are also fed to a digital/analog converter working into a decibel meter.

15 Claims, 1 Drawing Figure

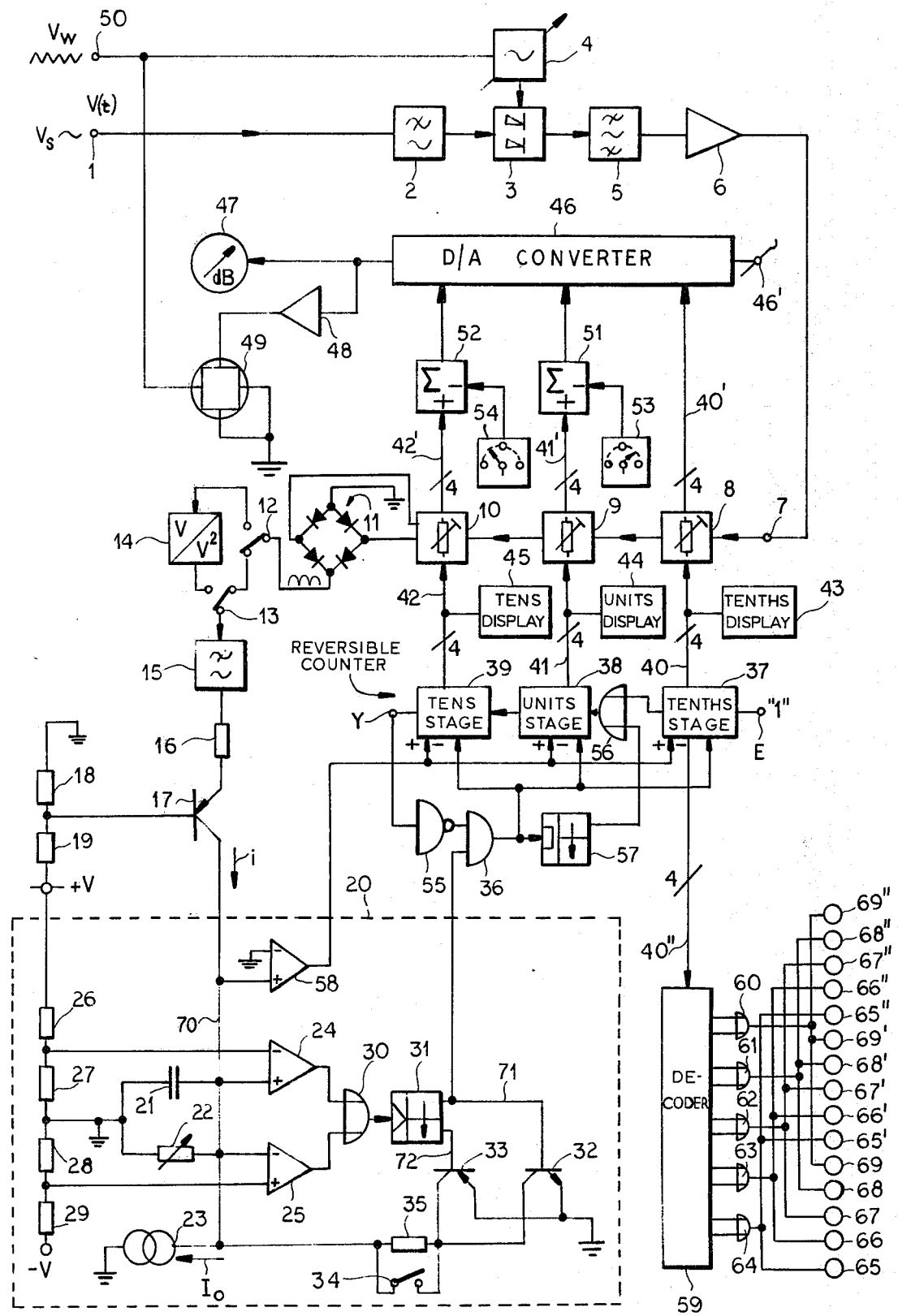

SYSTEM FOR MEASURING SIGNAL LEVELS

FIELD OF THE INVENTION

Our present invention relates to a system for measuring the level of an incoming signal, e.g. the amplitude of an alternating current.

BACKGROUND OF THE INVENTION

In commonly owned U.S. Pat. No. 3,584,294 there has been disclosed a system of this type in which an incoming a-c signal, after passing through a test pad or over a path independent thereof, is fed to a heterodyning stage including a mixer connected to a local oscillator for producing a beat-frequency oscillation which traverses a multistage digital attenuator controlled by a reversible binary counter. The latter is stepped at a fast or a slow rate by a respective pulse generator of fixed cadence. The counter stops when the attenuated signal matches a reference signal, the amount of attenuation required for the match being a measure of the original signal amplitude and being ascertainable from an analog indicator receiving the count through a digital/analog converter.

OBJECT OF THE INVENTION

The object of our present invention is to provide an improved level-measuring system of this type in which the desired equality with a reference signal can be brought about more rapidly and with a high degree of precision.

SUMMARY OF THE INVENTION

In accordance with our present invention we provide a capacitor connected to an output circuit of a digitally adjustable attenuator for charging by a bipolar current corresponding to the difference between two mutually opposing currents, namely a calibration current obtained by suitable circuitry from the attenuated input signal and a constant reference current connected in bucking relationship with the attenuator to that output circuit; the polarity of this resulting current thus depends upon the relative magnitudes of the calibration and reference currents. A threshold sensor connected across the capacitor unblocks a discharge path therefor when the charge attains an absolute magnitude surpassing a predetermined limit, thereby generating a train of switching pulses of a recurrence period which varies inversely with the absolute magnitude of the aforementioned resulting current. The switching pulses are fed to a reversible counter controlling the setting of the attenuator, as in the above-identified U.S. Pat. No. 3,584,294, for stepping same in a forward or backward direction as determined by the output of a polarity discriminator such as a differential amplifier also connected across the capacitor, the sense of stepping being such as to reduce the difference between the calibration and reference currents to substantially zero. When this happens, the generation of switching pulses is halted and the counter stops in a position which can be read on an associated indicator, preferably after digital/analog conversion as in the system of the prior patent.

With the attenuator and the counter divided into stages, the switching pulses may be simultaneously delivered to all the counter stages in parallel but any higher-ranking stage is enabled to be stepped thereby only in the presence of a carry from an immediately preceding stage. According to an advantageous further feature of our invention, a timer such as a monoflop connected to an enabling input of at least one such higher-ranking stage and to the threshold sensor makes that stage steppable by a switching pulse independently of a carry whenever the switching pulses have a recurrence period less than a predetermined duration.

Pursuant to another feature of our invention, an incoming signal heterodyned with a local oscillation as in the prior patent is rectified downstream of the attenuator and may be selectively routed through a squarer in order to allow the measuring of either the actual voltage of the rectified signal or its RMS value.

BRIEF DESCRIPTION OF THE DRAWING

The above and other features of our invention will now be described in detail with reference to the accompanying drawing the sole FIGURE of which is a circuit diagram of a representative embodiment.

SPECIFIC DESCRIPTION

As shown in the drawing, an input terminal 1 receives an a-c signal $V_S$ (e.g. a high-frequency carrier) fed via a low-pass filter 2 to a mixer 3 also connected to the output of a local oscillator 4. A resulting beat-frequency oscillation of a selected intermediate frequency traverses a band-pass filter 5 and an amplifier 6 on its way to an input 7 of a stree-stage digital attenuator whose cascaded stages, 8, 9 and 10 are decadically settable by binary control signals arriving over respective four-lead multiples 40, 41 and 42 from corresponding stages 37, 39 and 39 of a reversible pulse counter. The last attenuator stage 10 works into a rectifier bridge 11 which delivers a pulsating voltage, proportional to the amplitude of the attenuated incoming signal, by way of two cascaded switches 12 and 13 as well as a low-pass filter 15 and a resistor 16 to the emitter of a PNP transistor 17. Switches 12 and 13 are jointly reversible to insert a squarer 14 into the signal path for enabling the measurement of RMS values.

Transistor 17, whose base receives a fixed biasing potential from a voltage divider consisting of two resistors 18 and 19 connected between positive voltage and ground, generates a current i proportional to signal amplitude (or to its RMS value) which will be referred to as a calibration current and passes to ground through an output circuit including a preferably adjustable resistor 22 tied to the collector lead 70 of the transistor. A constant-current generator 23 in converter 20, connected between lead 70 and ground, draws a reference current $I_O$ through the resistor 22 in bucking relationship with calibration current i so that the voltage drop across this resistor will be zero when the two currents are equal. Resistor 22 shunts a capacitor 21 which, in the absence of a match between currents i and $I_O$, acquires a charge whose magnitude and polarity are determined by the amount and the sign of the difference between the two currents.

Converter 20 further includes a differential amplifier 58 with one input grounded and another input connected to collector lead 70 so as to act as a polarity sensor. A noninverting input of a comparator 24 and an inverting input of a comparator 25, designed as operational amplifiers, are connected to lead 70, and thus to the junction of capacitor 21 with resistor 22; their other inputs are fixedly biased via respective voltage dividers 26, 27 and 28, 29. The first of these dividers, lying between potential $+V$ and ground, feeds positive voltage to the inverting input of amplifier 24 which therefore has a positive output only when the voltage of capacitor 21 is more positive than the junction of resistors 26 and 27. Conversely, resistors 28 and 29 of the other divider lie between ground and voltage $-V$ so that their junction, supplying negative voltage to the noninverting input of amplifier 25, must be more positive than the capacitor voltage in order that this amplifier have a positive output. The two amplifiers 24 and 25 work into a common OR gate 30 which, therefore, conducts only when the charge of capacitor 21 has an absolute value exceeding that of one or the other biasing potential.

A monostable multivibrator or monoflop 31, triggerable by a pulse from OR gate 30, has two output leads 71 and 72 extending to the respective bases of an NPN transistor 32 and a PNP transistor 33 whose emitters are grounded and whose collectors are connected to lead 70 through a resistor 35 which may be manually short-circuited by a switch 34. Normally, with monoflop 31 emitting low voltage on lead 71 and high voltage on lead 72, both transistors are cut off. When the monoflop is tripped, the voltage levels are reversed so that transistors 32 and 33 become conductive, a discharge path for the capacitor 21 being established by one or the other transistor depending on the polarity of the charge. During the off-normal period of monoflop 31, the discharge may be either partial or complete in accordance with the open or closed state of bypass switch 34. The charging rate of capacitor 21 can be varied by adjustment of resistor 22.

The switching pulse appearing on lead 71 upon the tripping of monoflop 31 is also fed to one input of an AND gate 36 whose other input is normally energized via an inverter 55 connected to an output of the highest-ranking counter stage 39 on which a carry Y is present when the counter is stepped beyond its capacity. As long as the counter is not overdriven, AND gate 36 conveys the switching pulses from monoflop 31 in parallel to respective stepping inputs of counter stages 37, 38 and 39 which in the present instance are assumed to set the associated attenuator stages 8, 9 and 10 in steps of 0.1, 1 and 10 units, respectively. An enabling input E of the lowest-ranking stage 37 is permanently energized with a logical "1". The other two stages 38 and 39 have enabling inputs connected to respective carry outputs of the next-lower stages so as to respond to a switching pulse from gate 36 only if a carry from the immediately preceding state is simultaneously present. An OR gate 56, interposed between the carry output of counter stage 37 and the enabling input of counter stage 38, has an alternate input connected to the off-normal output of a retriggerable monoflop 57 which is tripped by the trailing edges of switching pulses from AND gate 36.

Digital indicators 43, 44 and 45 are connected to the respective output multiples 40, 41 and 42 of counter stages 37, 38 and 39. Multiple 40 of stage 37 also has a branch 40'' extending to a decoder 59 of another visual indicator which, via a group of OR gates 60–64, selectively energizes an array of signal lamps divided into three sets 65–69, 65'–69' and 65''–69'' of five lamps each, corresponding lamps of all three sets being lit simultaneously to indicate the current setting of counter stage 37. Thus, for example, lamps 65, 65', 65'' will light up when the digit is 0 or 5, lamps 66, 66', 66'' will be lit for digit 1 or 6, and so forth. In actual practice, these three sets of lamps may be arrayed in a circle along which the lights will travel in one direction or the other according to whether the counter is being stepped forward or backward. The sense of stepping is determined by the output of amplifier 58 transmitted to respective polarity inputs of stages 37, 38 and 39.

Branches 40', 41' and 42' of the output multiples 40, 41 and 42 of the several counter stages extend to a digital/analog converter 46 which translates their binary codes into a setting voltage for a meter 47 graduated, advantageously, in dB. The output of converter 46 is also transmitted, via an amplifier 48, to a vertical-deflection electrode of an oscilloscope 49 having a horizontal-deflection electrode connected, in parallel with a control input of local oscillator 4, to a terminal 50 to which a preferably sawtooth-shaped modulating or "wobbling" signal $V_w$ may be applied. Oscilloscope 49 will then display the variations in signal level over a certain frequency range, e.g. in the case where the incoming signal $V_s$ is of the broad-band type and transmitted through a test pad as described in prior U.S. Pat. No. 3,584,295. Instead of the oscilloscope, or in addition, we may connect an analog recorder to the output of converter 46.

As further shown in the drawing, branches 41' and 42' of the output multiples of the two higher-ranking counter stages 38 and 39 include respective adders 51 and 52 with subtractive inputs connected to digital selectors 53 and 54 which are manually operable to introduce a supplemental count for shifting the reading of meter 47 to different sections of its scale when the slope of converter 46, adjustable with the aid of a setting member 46', is such that only a fraction of that scale is utilized to indicate the full digital range (from 00.0 through 99.9) of counter 37–39. Thus, with the scale of meter 47 extending over $-100$ dB, a converter slope of 1:5 would compress the full count into a subrange of 20 dB which in the absence of a supplemental count would appear in the scale portion between $-80$ and $-100$ dB; a preloading with a count equivalent to, say, 20 dB would then result in utilization of a scale portion between $-60$ and $-80$ dB.

In operation, counter 37–39 will operate normally as long as the recurrence period of the switching pulses from monoflop 31 exceeds the off-normal period of monoflop 57 so that a new switching pulse occurs only after the disappearance of a timing pulse in the output of the latter monoflop. When the difference between calibration current i and reference current $I_O$ is so large that the switching pulses follow one another more rapidly, such a pulse will reach the stepping input of stage 38 while its enabling input is still energized by a timing pulse from monoflop 57 triggered by the trailing edge of the immediately preceding switching pulse. In that instance the new switching pulse will step the units stage 38 regardless of the setting of the tenths stage 37 so that counting, either forward or backward, will occur at ten times the normal rate until the two currents are more nearly equal. This further accelerates the attainment of the state of equilibrium which the operator will recognize by the halting of the traveling lights of array 65–69 etc. and which will allow the meter 47 to be read.

The system according to our invention may also be used for selective measurement of noise signals with the aid of an overloaded receiving amplifier, for example. Especially for such noise measurements it will be desirable to close the bypass switch 34 to optimize the evaluation of rapidly fluctuating signal levels.

We claim:

1. A system for measuring the level of an incoming signal, comprising:

input means for receiving said incoming signal;

circuitry including digitally adjustable attenuation means connected to said input means for converting said incoming signal into a calibration current in an output circuit thereof;

reversible pulse-counting means connected to said attenuation means for adjusting same;

a source of constant reference current connected in bucking relationship with said attenuation means to said output circuit for producing a bipolar resulting current corresponding to the difference between said calibration and reference currents;

capacitive means connected to said output circuit for charging by said resulting current with a polarity depending upon the relative magnitudes of said calibration and reference currents;

threshold-sensing means connected to said capacitive means for unblocking a discharge path for said capacitive means upon the charge thereon attaining an absolute magnitude surpassing a predetermined limit, thereby generating a train of switching pulses with a recurrence period varying inversely with the absolute magnitude of said resulting current;

polarity-discriminating means connected across said capacitive means, said pulse-counting means being connected to said threshold-sensing means for stepping by said switching pulses in a direction determined by an output of said polarity-discriminating means with consequent adjustment of said attenuation means to reduce the difference between said calibration and reference currents to substantially zero; and indicator means connected to said pulse-counting means for reading out the amount of attenuation required for substantial equalization of said calibration and reference currents.

2. A system as defined in claim 1 wherein said attenuation means is divided into a plurality of cascaded attenuator stages and said pulse-counting means is divided into a like plurality of cascaded counter stages respectively controlling said attenuator stages, said counter stages being provided with respective stepping inputs connected in parallel to said threshold-sensing means for simultaneously receiving said switching pulses therefrom, said counter stages including a lowest-ranking stage and at least one higher-ranking stage provided with an enabling input connected to an output of the immediately preceding counter stage for making said higher-ranking stage steppable by a switching pulse in the presence of a carry from the preceding stage.

3. A system as defined in claim 2, further comprising timing means connected to said enabling input and to said threshold-sensing means for making said higher-ranking stage steppable by a switching pulse independently of said carry upon said recurrence period having less than a predetermined duration.

4. A system as defined in claim 3 wherein said timing means comprises a retriggerable monoflop responsive to a trailing edge of a switching pulse, said monoflop and the carry output of said preceding stage being connected to said enabling input through a common OR gate.

5. A system as defined in claim 2 or 3, further comprising gate means inserted between said threshold-sensing means and said stepping inputs for blocking the transmission of switching pulses in the presence of a carry on an output of the highest-ranking counter stage.

6. A system as defined in claim 1, 2 or 3 wherein said threshold-sensing means comprises a pair of operational amplifiers with fixedly biased inverting and noninverting inputs, respectively, and with other inputs connected to said capacitive means, a one-shot pulse generator triggerable by said operational amplifiers, and normally blocked electronic switch means in said discharge path connected to said pulse generator for temporary unblocking thereby.

7. A system as defined in claim 6, further comprising an adjustable shunt resistance connected in parallel with said discharge path across said capacitive means.

8. A system as defined in claim 6 wherein said discharge path includes a manually short-circuitable series resistor.

9. A system as defined in claim 2 or 3 wherein said indicator means comprises a digital/analog converter with input connections to said counter stages and an analog meter connected to an output of said converter.

10. A system as defined in claim 9 wherein said converter is provided with a slope-adjusting means for varying the spread of its analog output signals between the full extent and a fractional extent of a scale of said meter, further comprising arithmetic means inserted between said pulse-counting means and said converter for enabling a selective introduction of supplemental counts establishing different range limits for said analog output signals on said scale.

11. A system as defined in claim 1, 2 or 3 wherein said incoming signal is an alternating current, said input means comprising a local oscillator and mixer means for heterodyning said alternating current with an output oscillation of said oscillator for converting said incoming signal into a beat-frequency oscillation fed to said attenuation means, said circuitry including rectifier means downstream of said attenuation means.

12. A system as defined in claim 11 wherein said circuitry further includes a transistor with an emitter connected to said rectifier means, a base connected to a point of fixed biasing potential, and a collector connected to said output circuit.

13. A system as defined in claim 12 wherein said circuitry further includes a squarer insertable between said rectifier means and said transistor.

14. A system as defined in claim 11 wherein said local oscillator has a frequency-adjusting input connected to a supply of control voltage, said indicator means including a digital/analog converter and an oscilloscope having a horizontal-deflection input connected to said supply and a vertical-deflection input connected to said converter.

15. A system as defined in claim 2 or 3, further comprising a decoder connected to said lowest-ranking stage and display means controlled by said decoder for visualizing the direction of stepping of said lowest-ranking stage.

* * * * *